US006951263B2

(12) United States Patent
Blömeling et al.

(10) Patent No.: US 6,951,263 B2
(45) Date of Patent: Oct. 4, 2005

(54) SOUND ABSORBER, ESPECIALLY FOR MOTOR VEHICLES, AND A METHOD FOR PRODUCING A SOUND ABSORBER

(75) Inventors: Heinz Blömeling, Leichlingen (DE); Christian Gnädig, Mechernich (DE)

(73) Assignee: Carcoustics Tech Center GmbH, Leverkusen (DE)

( * ) Notice: Subject to any disclaimer, the term of this patent is extended or adjusted under 35 U.S.C. 154(b) by 123 days.

(21) Appl. No.: 10/257,526

(22) PCT Filed: Apr. 10, 2001

(86) PCT No.: PCT/EP01/04096

§ 371 (c)(1),
(2), (4) Date: Apr. 11, 2003

(87) PCT Pub. No.: WO01/76914

PCT Pub. Date: Oct. 18, 2001

(65) Prior Publication Data

US 2003/0159880 A1 Aug. 28, 2003

(30) Foreign Application Priority Data

Apr. 12, 2000 (DE) .......................................... 100 18 088
Mar. 31, 2001 (DE) .......................................... 101 16 261

(51) Int. Cl.$^7$ ................................................ F01N 1/26
(52) U.S. Cl. ..................................................... 181/204
(58) Field of Search ........................ 181/204, 198–203, 181/205, 212

(56) References Cited

U.S. PATENT DOCUMENTS

| 4,247,513 | A | | 1/1981 | Liu |
| 5,064,709 | A | | 11/1991 | Tschudin-Mahrer |
| 5,462,395 | A | | 10/1995 | Damm et al. |
| 5,509,247 | A | * | 4/1996 | Fortez et al. ................. 52/630 |
| 5,823,600 | A | * | 10/1998 | Iwao ......................... 296/39.3 |
| 6,382,350 | B1 | * | 5/2002 | Jezewski et al. ............ 181/290 |

FOREIGN PATENT DOCUMENTS

| DE | 31 12 591 | 10/1982 |
| DE | 43 10 002 | 4/1994 |
| EP | 0062166 | 10/1982 |
| EP | 0844139 | 5/1998 |
| WO | WO 89/02364 | 3/1989 |
| WO | 8902364 | 3/1989 |
| WO | 9831566 | 7/1998 |

* cited by examiner

Primary Examiner—Kimberly Lockett
(74) Attorney, Agent, or Firm—Collard & Roe, P.C.

(57) ABSTRACT

A sound absorber (A), especially for motor vehicles, comprising a layer (4) of absorption material, such as open-pored or optionally closed pored foamed material or a wood fiber composite, and a top layer (5). The aim of the invention is to produce an absorber in such a way that said absorber is easy to produce and assemble and functions well. According to the invention, the top layer (5) for leading through a loom of cables (8) or the like is provided with a tubular recess (40) for leading through a loom of cables. Said recess (4) is provided with groove-like undercuts (42) on the outside.

27 Claims, 15 Drawing Sheets

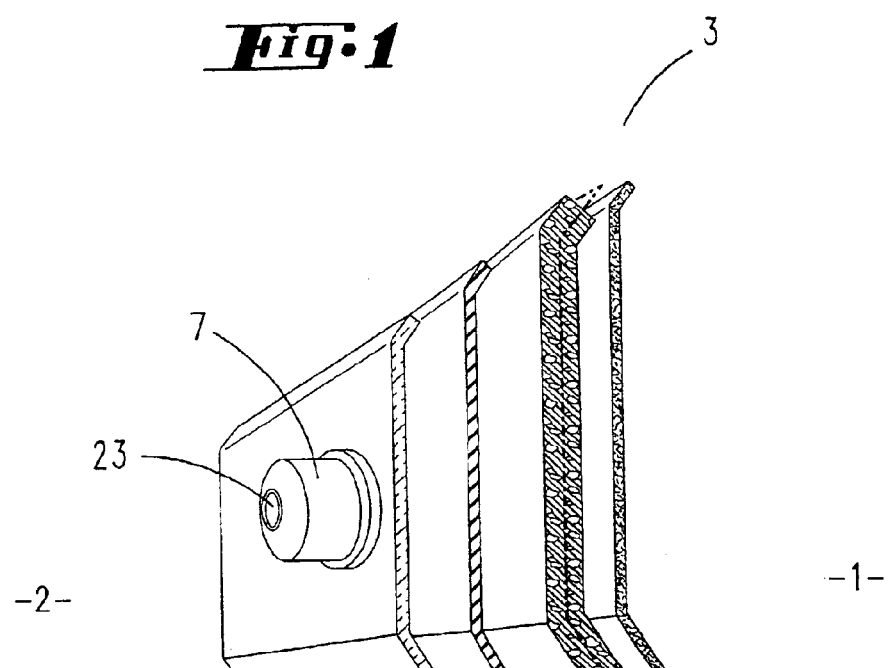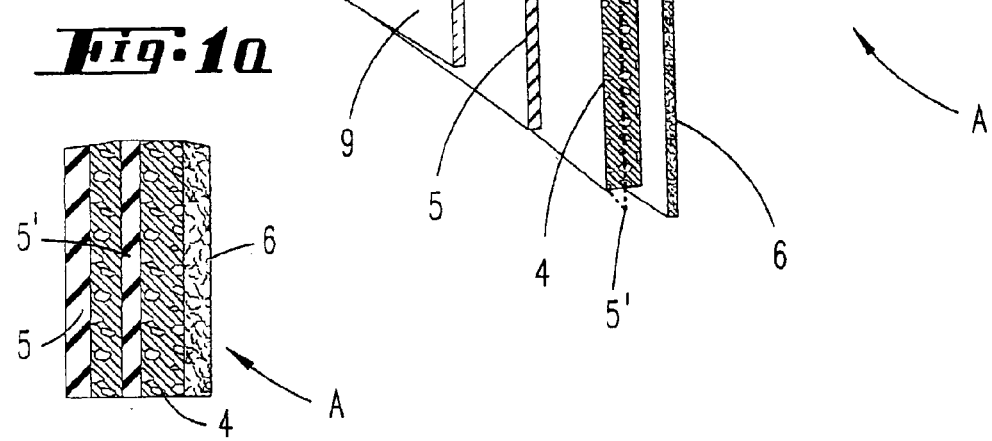

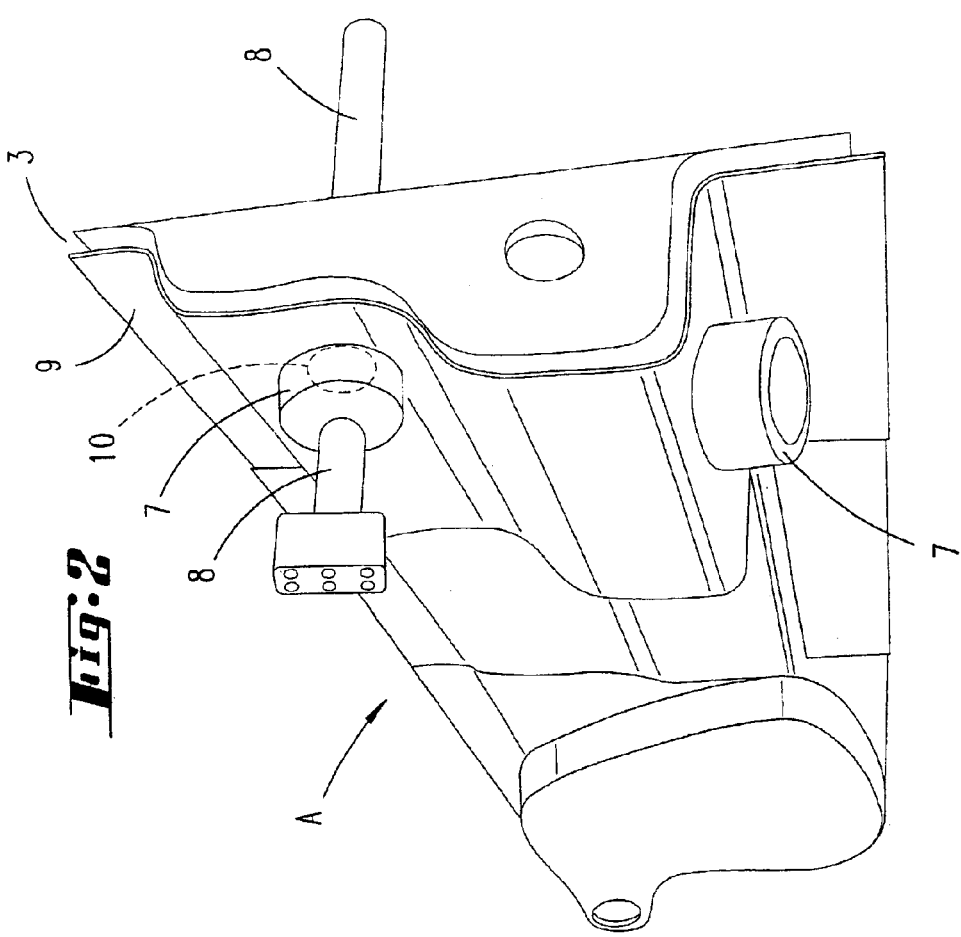

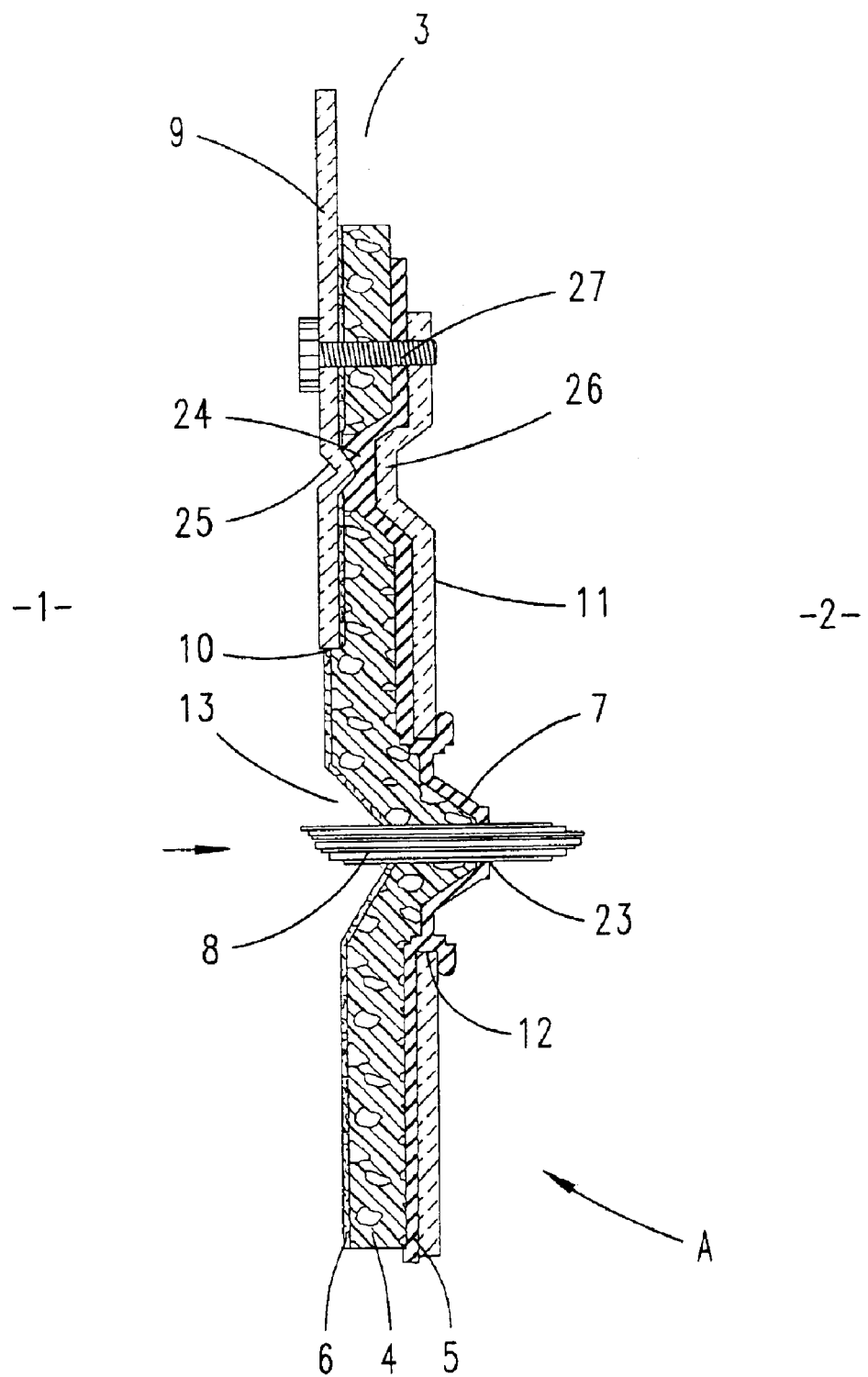

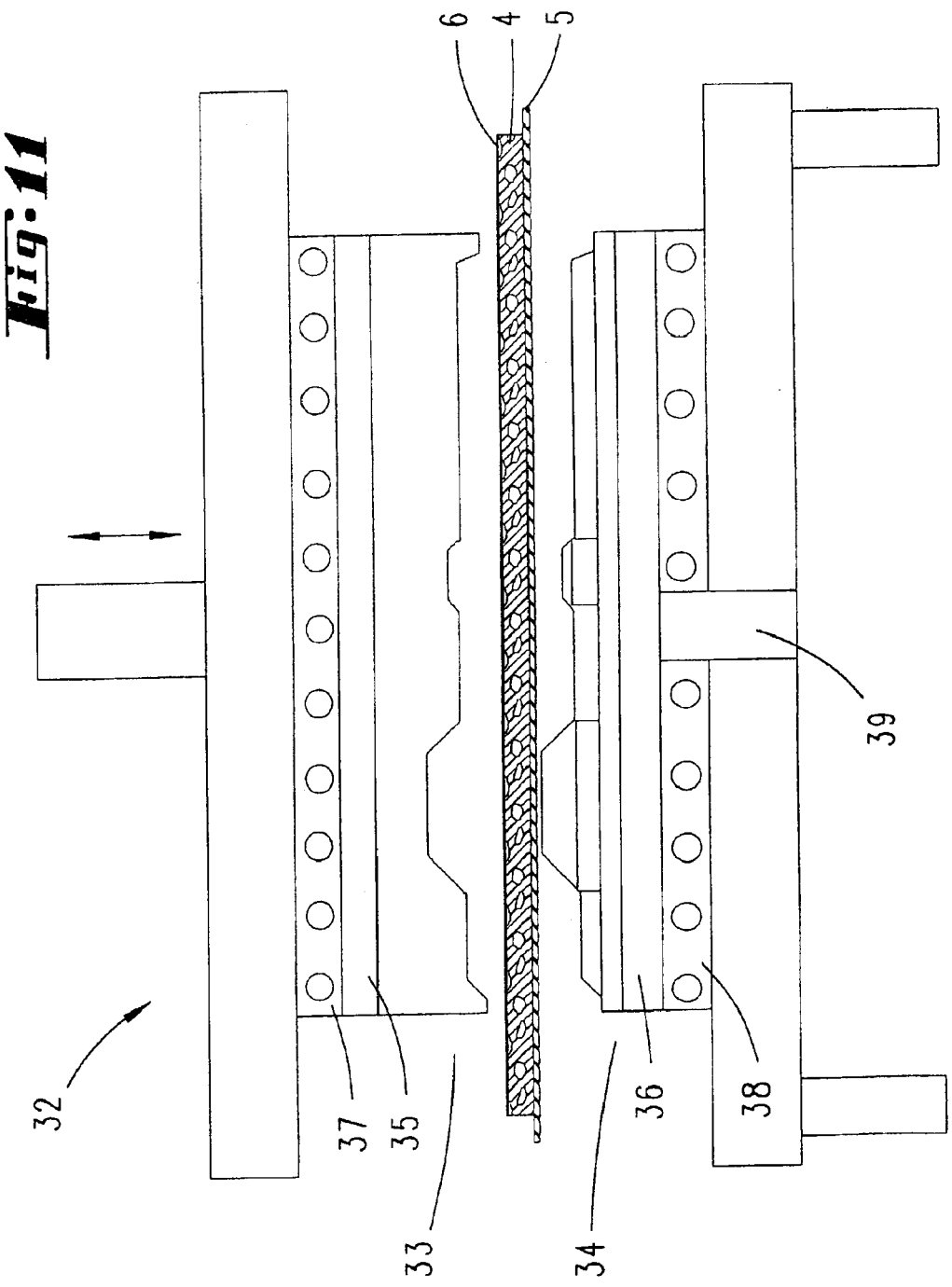

Figure 4:
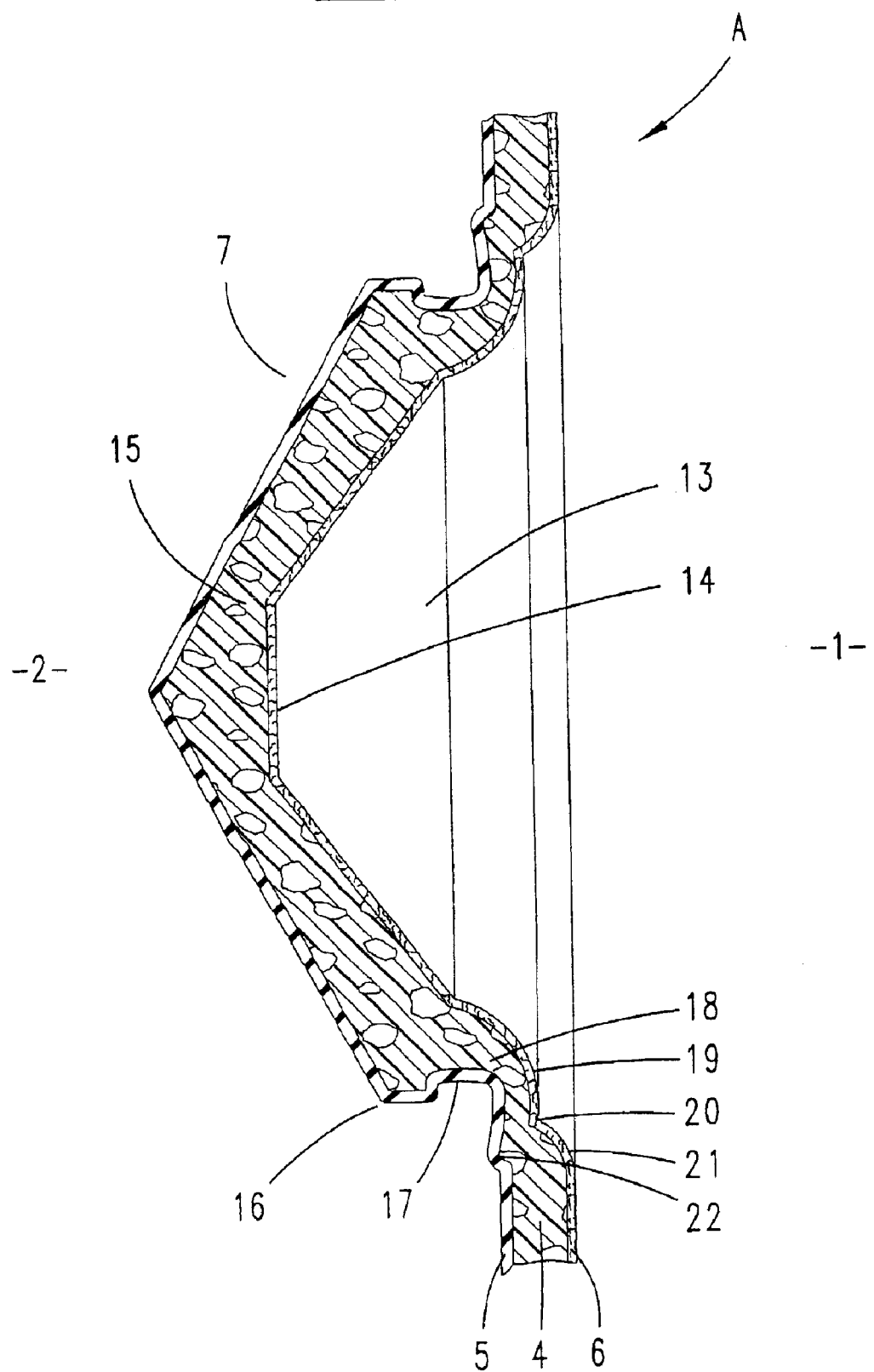

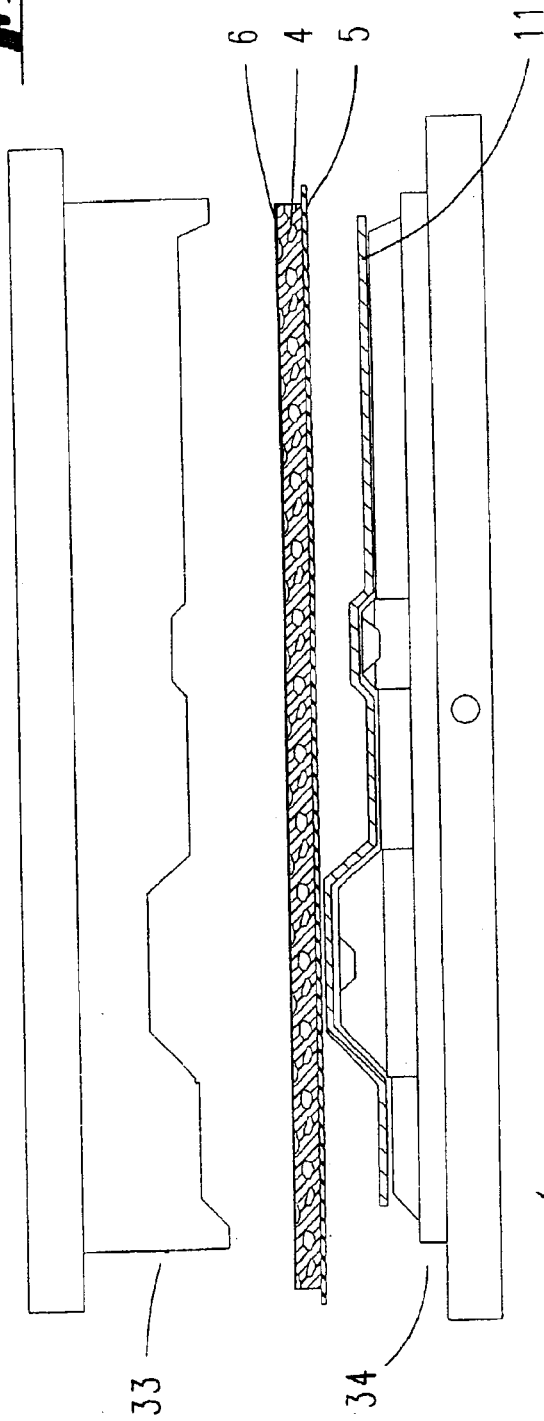
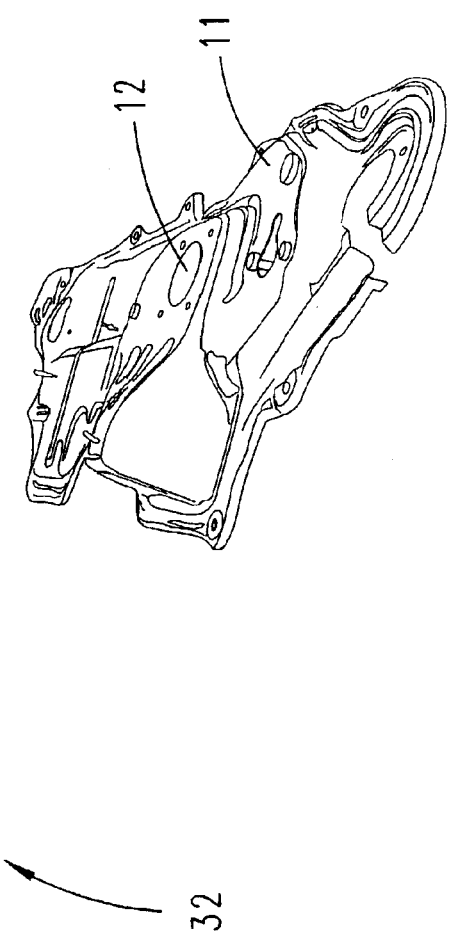

SOUND ABSORBER, ESPECIALLY FOR MOTOR VEHICLES, AND A METHOD FOR PRODUCING A SOUND ABSORBER

CROSS REFERENCE TO RELATED APPLICATIONS

Applicants claim priority under 35 U.S.C. §119 of GERMAN Application No. 100 18 088.4 filed on 12 Apr. 2000 and of GERMAN Application No. 101 16 261.8 filed on 31 Mar. 2001. Applicants also claim priority under 35 U.S.C. §365 of PCT/EP01/04096 filed on Apr. 10, 2001. The international application under PCT article 21(2) was not published in English.

The invention relates in the first instance to a sound absorber, especially for motor vehicles, comprising a layer of absorption material, such as open-cell or optionally closed-cell foamed material or a wood-fiber composite, and a top layer.

A composite part in the form of a sound absorber of this type is disclosed by WO 89/02364. The layer which consists there of rubber material is made to overlap the edge of the layer formed from absorption material, to be precise the portions to be joined taper oppositely in the region in which they overlap.

U.S. Pat. No. 4,247,513 proposes joining a layer of foamed material to a previously unvulcanized rubber layer by heat and pressure. The solid rubber layer is thereby fully vulcanized. The two layers are consequently bonded together without any special adhesive agents.

It is an object of the invention to form an absorber of the generic type in such a way that it is advantageous in terms of how it is produced and functions and is easy to assemble.

This object is achieved in the first instance and substantially by a sound absorber having the features of claim 1, it being provided that the top layer has a tubular cable lead-through recess for leading through a cable loom or the like and that the recess has groove-like undercuts on the outside. As a result of this development, a sound absorber of the generic type with an enhanced functional value is achieved. The provision of a tubular recess consequently makes it possible for cables, shafts or the like to be led through from the passenger compartment of a motor vehicle to the engine compartment, the recess formed from the top layer being intrinsically stable, but in turn kept flexible for adapting to tolerances by the groove-like undercuts provided on the outside. In terms of material, fully vulcanized rubber material or silicone material is preferred with regard to the top layer and the recesses, or additionally materials having rubber-like properties, such as elastomers, for example EPDM, or thermoplastic elastomers (TPE), such as thermoplastic polyurethane for example. The groove-like undercutting of the recess allows a press-stud-like snap-in connection to be achieved between the recess and the body wall separating the engine compartment from the passenger compartment. To achieve a bellows-like shape of the recess, the undercuts are preferably formed by a screw-thread-shaped bead. This may be fashioned cross-sectionally in a rectangular, trapezoidal or else semicircular form. In this respect, other cross-sectional forms are also conceivable. As especially with regard to the desired flexibility of the cable lead-through recess, it further proves to be advantageous that the latter has on the inside a screw-thread-like groove, the latter being aligned concentrically in relation to the screw-thread-shaped bead. The progression of the screw-thread-like groove on the inside is evident on the outside by the likewise screw-thread-shaped bead. In a further configuration of the subject matter of the invention, it is provided that two threads of the groove are spaced apart in the vertical direction by a screw-thread-like cylindrical portion. It also proves to be advantageous that the recess has a central clearance, for leading through the cable loom or the like. In this respect, it may prove to be advantageous if the edge region of the central clearance is flexibly configured in such a way that it can butt in a lip-like manner against the led-through cable loom or the like. With respect to the groove-like undercut, it is further provided that the latter is formed in a triangular manner with two concave side lines running symmetrically in relation to each other, allowing a secure attachment of the tubular recess in the region of an aperture in a dividing wall.

The invention also relates to a sound absorber, especially for motor vehicles, comprising a layer of absorption material such as open-cell or optionally closed-cell foamed material or a wood-fiber composite, and a top layer. In order here, too, to form an absorber of the generic type in such a way that it is advantageous in terms of how it is produced and functions and is easy to assemble, it is proposed according to the invention that the top layer, which covers the layer of absorption material over virtually its full surface area, consists of thermoplastic elastomer, for example a fully vulcanized rubber material or silicone material, and that, for leading through a cable loom or the like, a stamped recess involving both layers is created. As a result of such a configuration, a sound absorber of the generic type with an enhanced functional value is achieved: the continuous top layer avoids acoustic leakages. Moreover, it undertakes sealing functions and represents an advantageous alternative to customary heavy absorber layers. On the other hand, the rubber material in the unvulcanized state allows sophisticated adaptation to relatively unusual structures of the car body parts to be covered. In a fully vulcanized state, on the other hand, there is a highly elastic layer, which is outstandingly suitable for sealing purposes, in particular in the region of lead-throughs. The stamped recess as such has the advantage of better establishing the location for intended plug-on attachment. A cable loom is consequently directed from the rear of the stamped recess virtually into an impression. Such a stamped recess is quite stable, since both layers are involved. Such sealing bushes or sleeves offer a highly elastic, perforated-membrane-like edge seal with respect to the lateral wall of the cable loom or the like. A stiffening that significantly exceeds limpness is obtained furthermore by the fact that in the stamped recess there is a compaction of the layer of absorption material, in any event locally. Such compactions produce stable zones. They can for example, stiffen an exposed zone of the stamped recess with a centering effect, and similarly a zone reserved for a snap-in connection. Accordingly, it proves to be advantageous with respect to the latter zone that a stamped recess has a peripheral bead at the base, and that furthermore the bead is a snap-in bead and, for this purpose, has an undercut. Corresponding manufacturing possibilities are offered, for example, by the thermoforming process. An especially high mechanical strength is achieved by the layer of absorption material being highly compacted in the region of the bead. It is further proposed that the stamped recess has a central stamped clearance. It is advantageous for relative positioning for plug-on attachment if the stamped recess has a conical outer contour. Furthermore, the invention proposes, both in connection with a configuration of the sound absorber as claimed in claim 1 and in connection with a configuration of the sound absorber as claimed in claim 7, that the layer of absorption material is covered with a nonwoven on the engine compartment side. It covers the framework of foamed material, or the structure of the fibers of the wood-fiber composite material or the like, so that an unfrayed sealing lip is obtained. It is then provided that the top layer of rubber or silicone material has thickenings as sealing beads. Edge beads of the car body can act against these sealing beads, so that, in conjunction with the classic means of attachment, sustainable relative positioning is obtained. It is then significant with regard to the additional function explained above that the layer of rubber or silicone material is selected with regard to a high weight per unit area to act as a heavy layer in acoustic association with the layer of absorption material. The sound absorber may also be drawn directly onto a carrier, following its structure on one broad side of the same, for example a carrier comprising an aluminium sheet, to be precise suitably by means of a thermoforming process with a vacuum connection in the mold cavity to produce on the stamped formations deep valleys and optionally undercut zones capable of snap-in engagement. It is further provided that a second layer of thermoplastic elastomer, for example a fully vulcanized rubber material or silicone material, is associated with the layer of absorption material. This variant is particularly effective in acoustic damping. Furthermore, it proves to be useful in structural terms that the second layer is associated with the layer of absorption material by being held in between. It may be central. Finally, it can alternatively be provided that an absorption layer is produced by the RIM process. In the case of this process, RIM polyurethane is preferably injected into a mold, dispensing with the need for an absorption layer to be compacted in a mold. An absorption layer produced in this way can also be combined with a top layer of, for example, rubber or silicone material and a nonwoven layer.

The invention also relates to a method for producing a sound absorber, especially for motor vehicles, comprising a layer of absorption material, such as open-cell or optionally closed-cell foamed material or a wood-fiber composite, and a top layer, the top layer having a cable lead-through recess for leading through a cable loom or the like. To improve a method of the type in question, especially with regard to the forming of the cable lead-through recess, it is proposed that the recess is produced by injection moulding around a core having an external thread. As a result of this configuration, a recess provided with a groove-like undercutting on the outside can be produced in an extremely simple way. The use of a material having rubber-like properties, such as RIM polyurethane for example, is preferred in this case. In an advantageous way, the method according to the invention allows a bellows-like geometry to be produced for components created by casting techniques, such as for example a cable lead-through recess. The core to be extrusion-coated in the course of the method and having the external thread may in this case be formed both as cylindrical and conically tapering. To obviate the need for complex undercut demolding, the method further proceeds by the sound absorber being demolded by unscrewing the core. Consequently, the core of a spiral geometry that is provided in the injection mold is able to be moved in and out with the same lead by a turning movement. The counter-mold is preferably formed by a second core, forming the outer contour, which has an inner contour corresponding to a screw thread geometry. As result of this, a recess which has on the outside a screw-thread-shaped bead, forming undercuts, and on the inside a screw-thread-like groove, aligned concentrically in relation to said bead, can be produced. After unscrewing the first, inner core, the sound absorber can be drawn, in the region of the recesses formed, on account of the given flexibility, mold forming the outer contour. Alternatively, it is proposed in this respect that, in the course of the demolding, both the inner core and the outer core are drawn out by turning, the turning movements of the cores in this case preferably being directed in opposite senses. In a development of the method, it is proposed that, in the first instance, the top layer is injection-molded and then the absorption layer is molded on by the RIM process. Consequently, for example, after completion of the top layer in a process as described above, the lower mold is positioned at a distance from the top layer, to create an intermediate space to be filled by injecting RIM polyurethane, for example.

Figure 5:
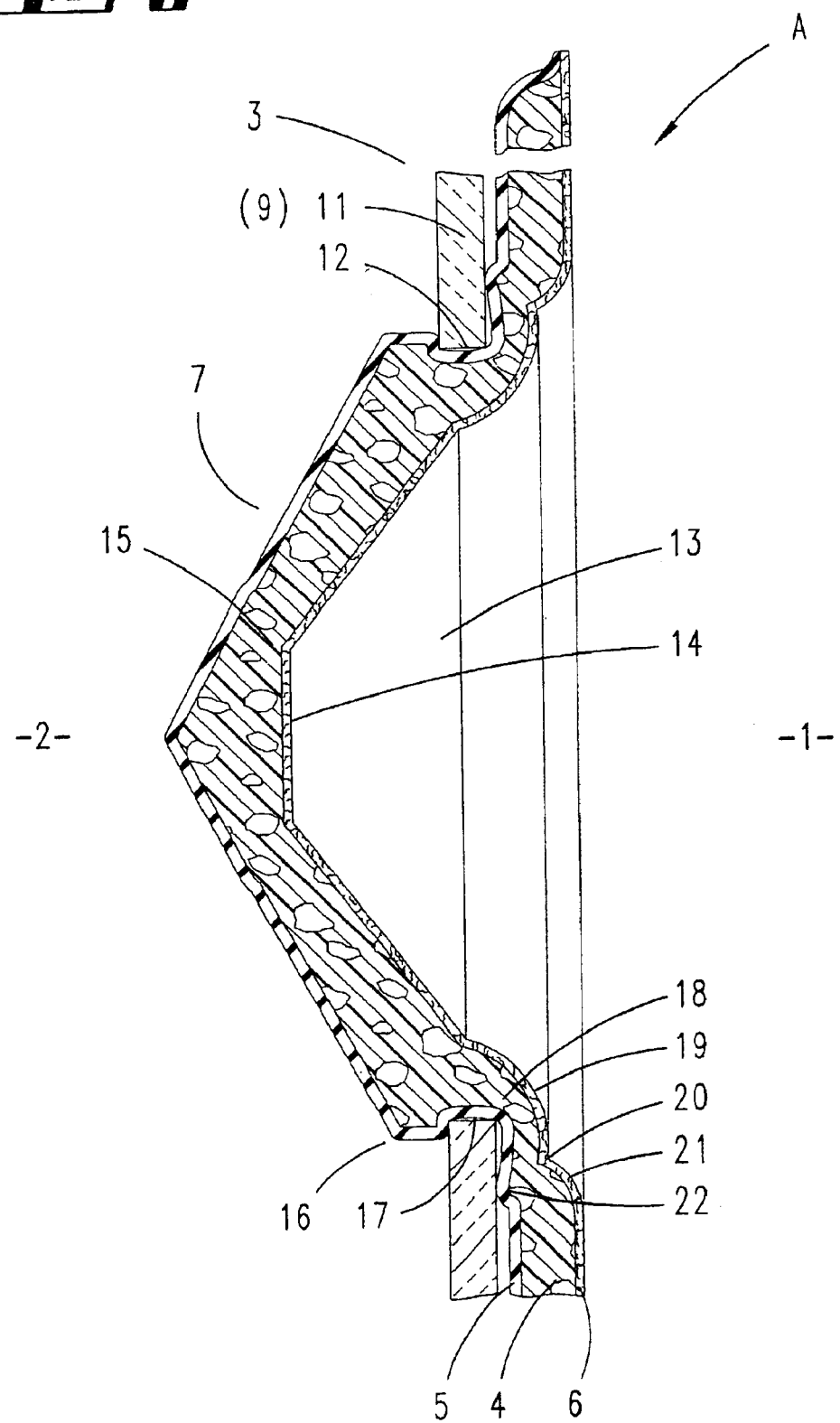
Figure 6:
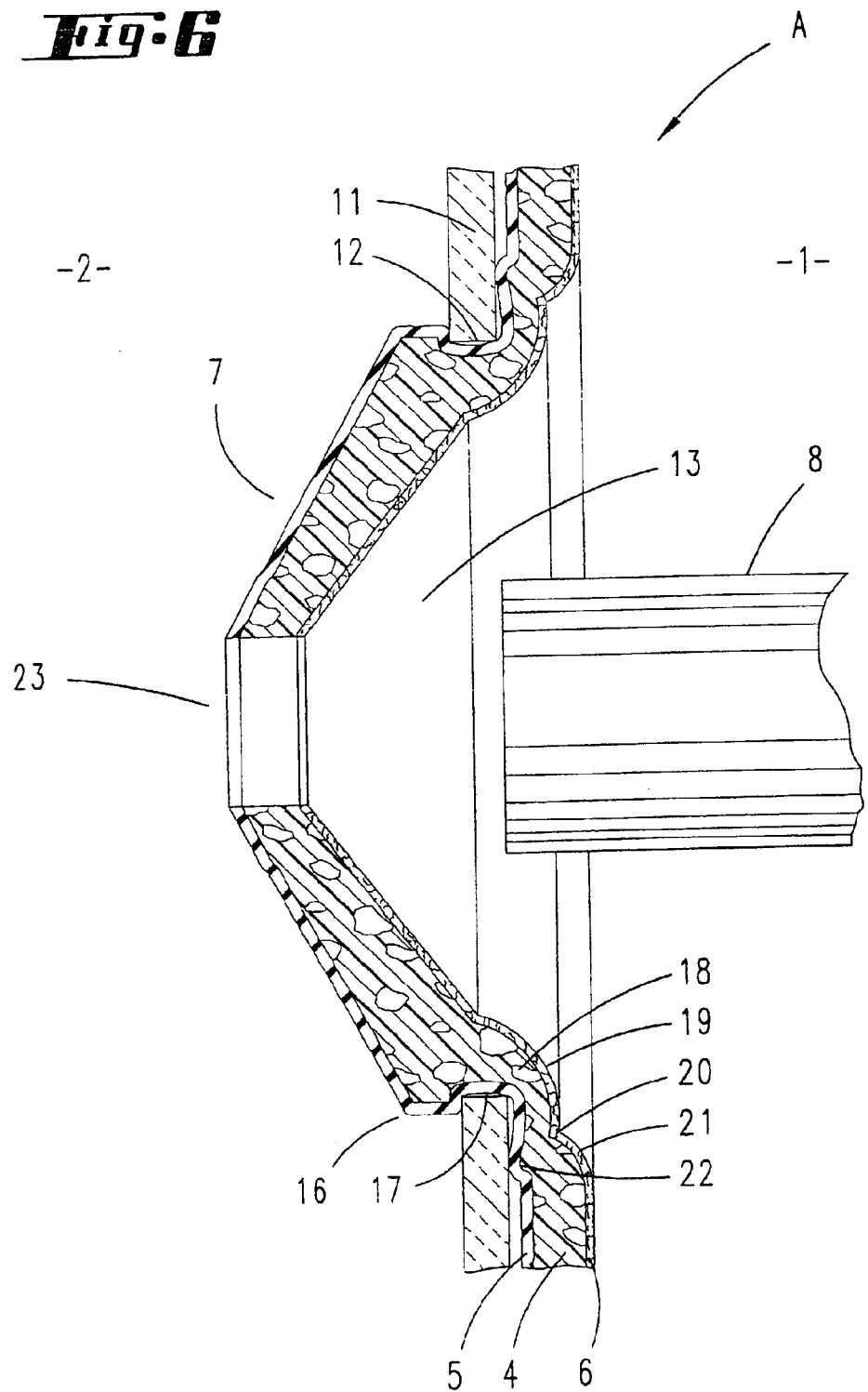
Figure 7:
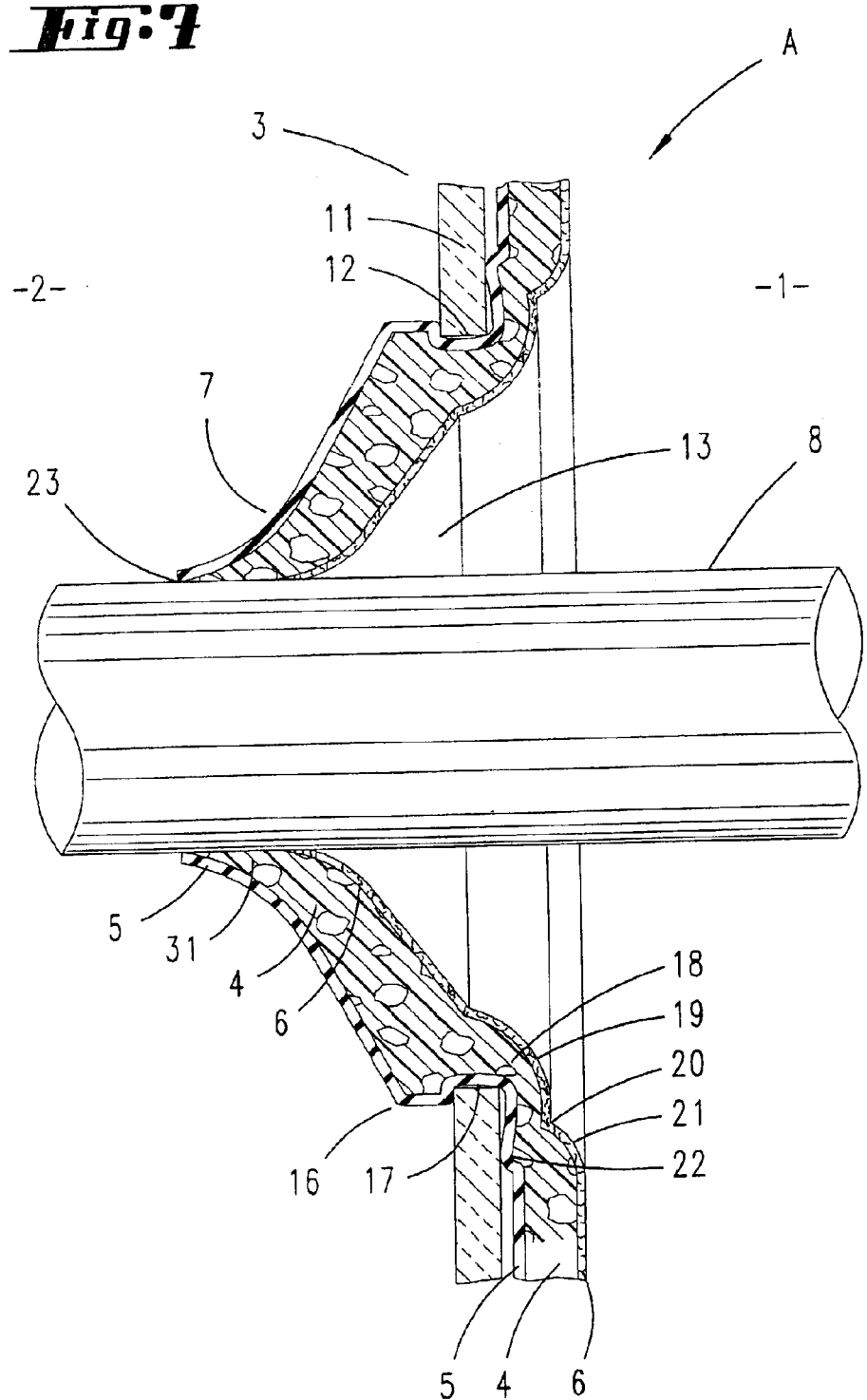
Figure 8:
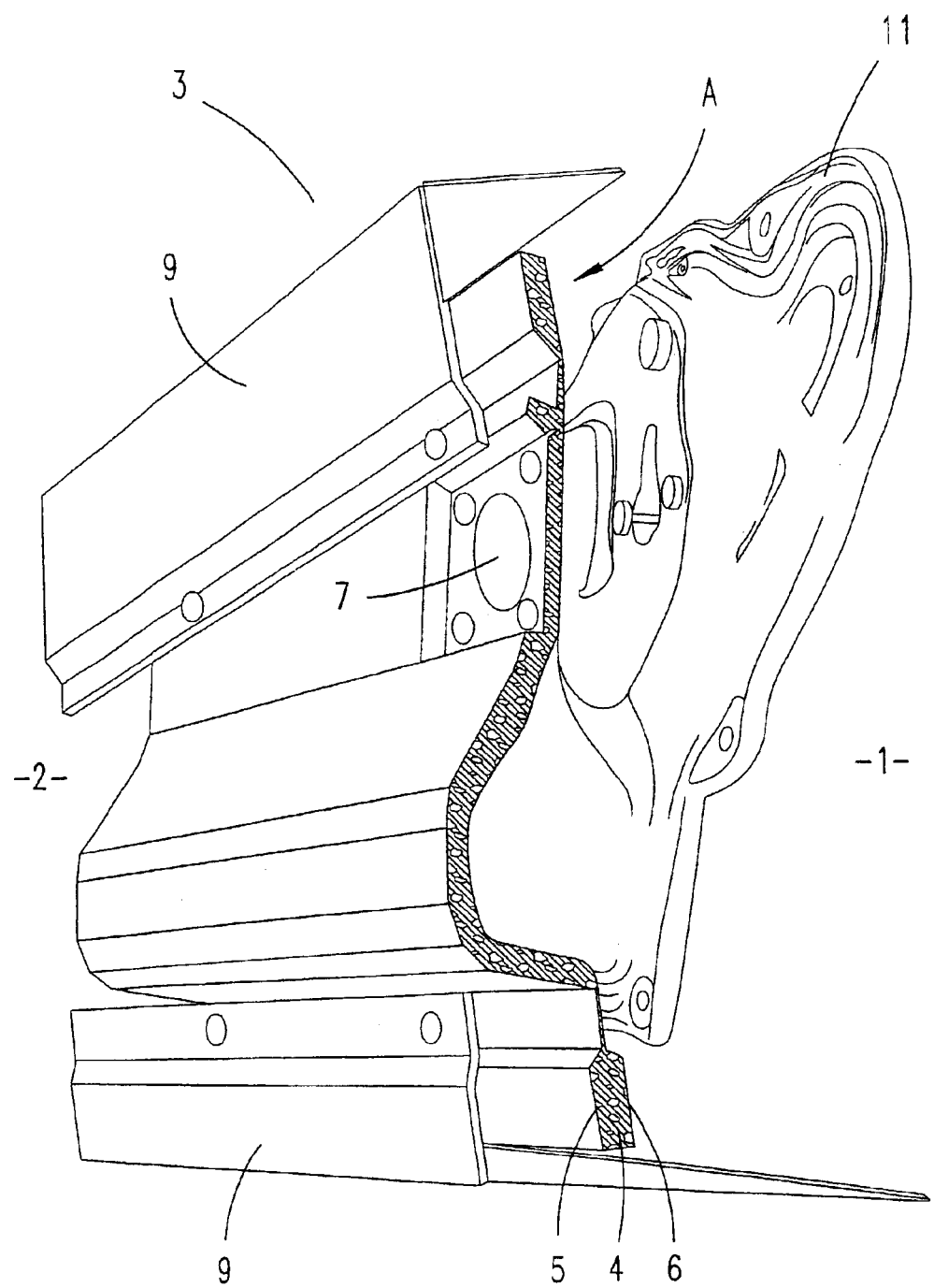
Figure 9:
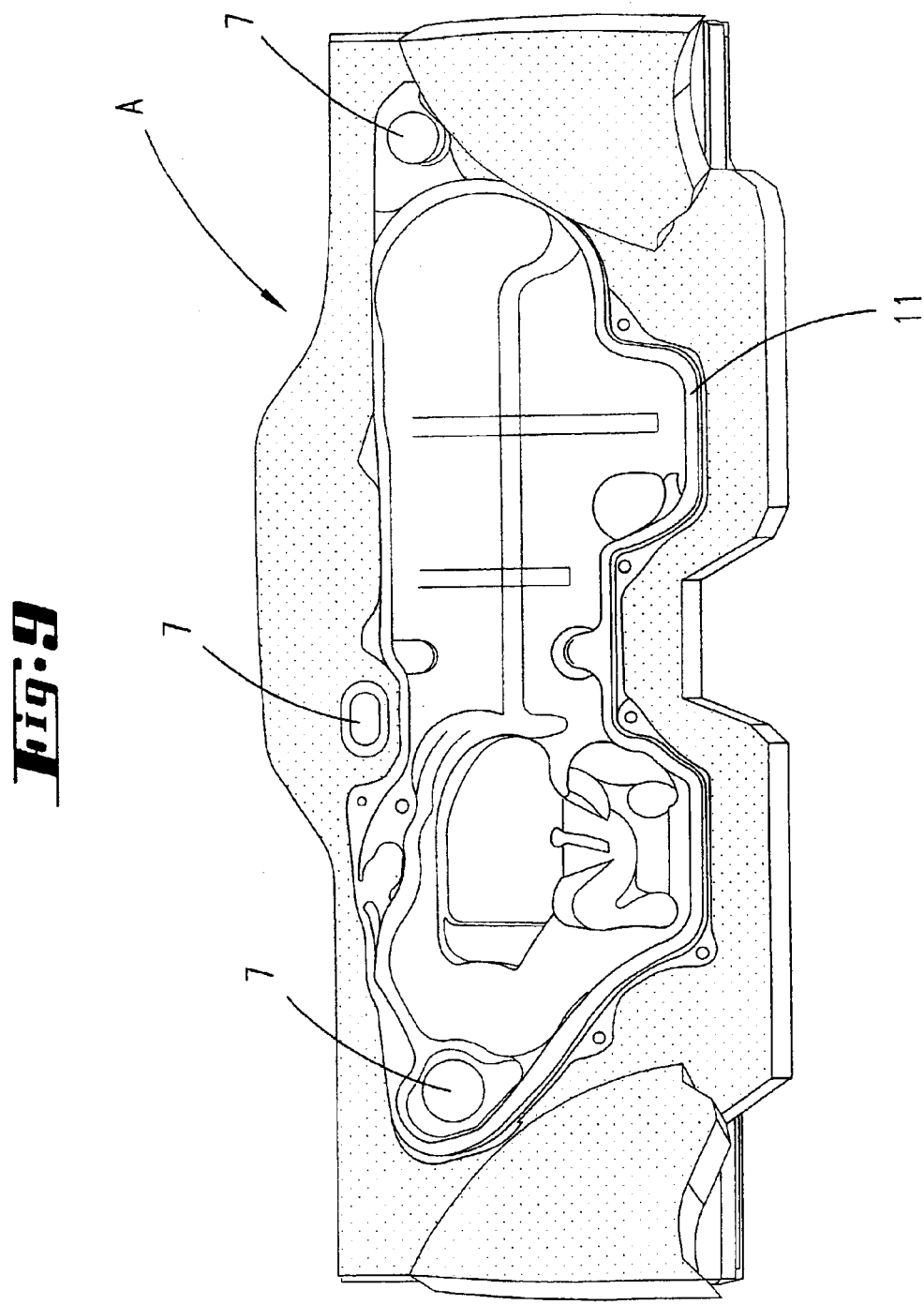
Figure 10:
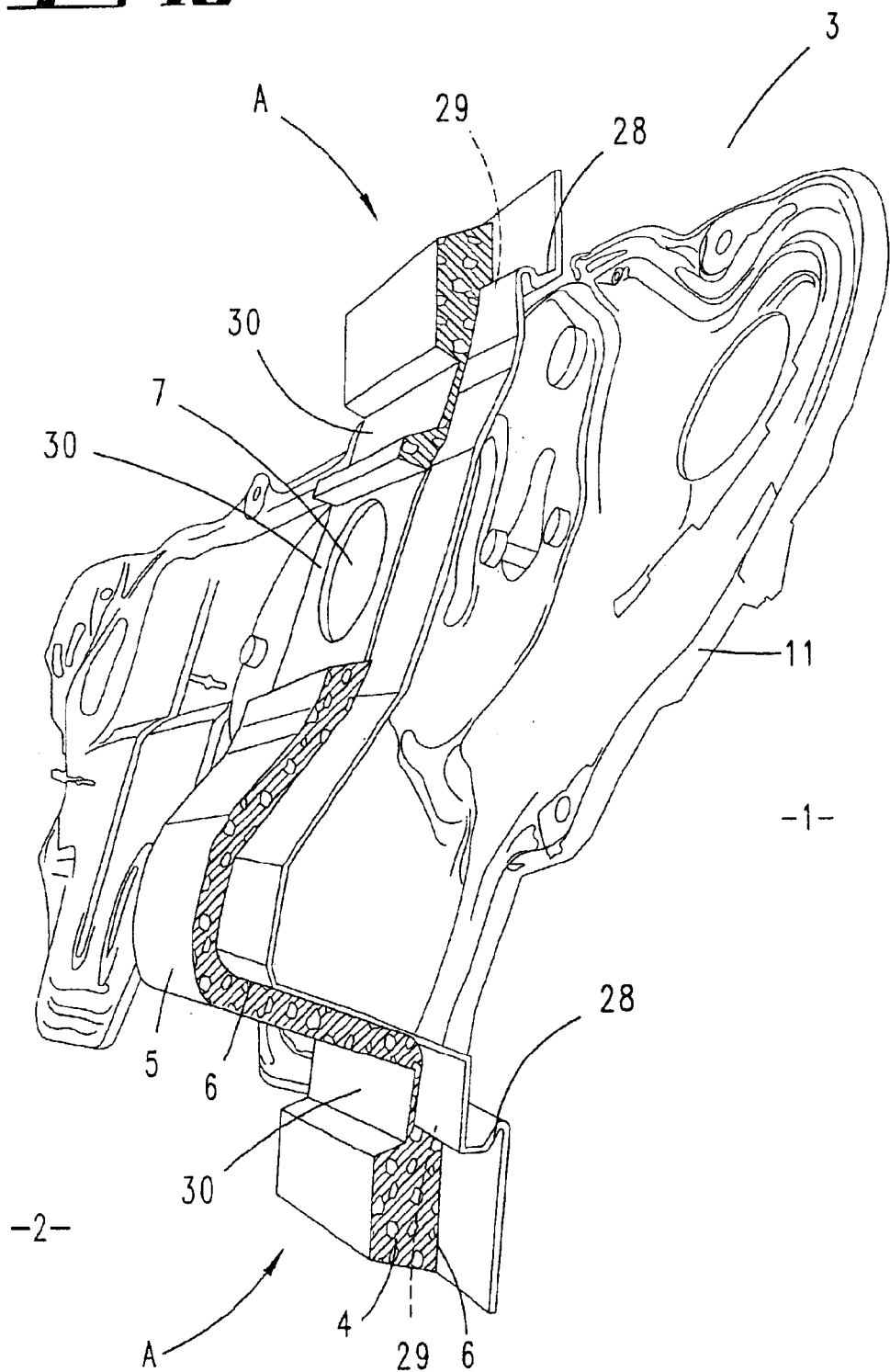
Figure 14:
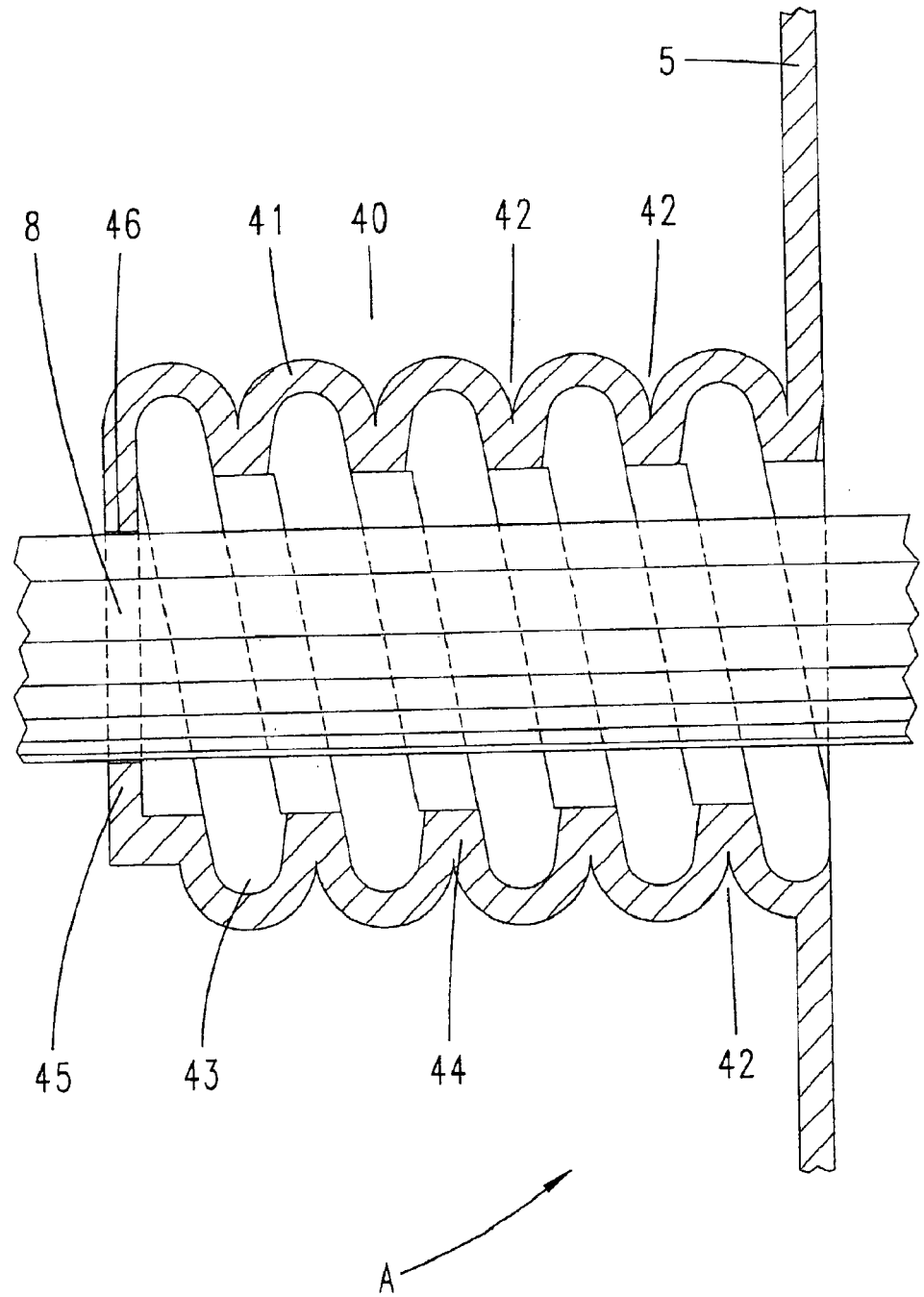
Figure 15:
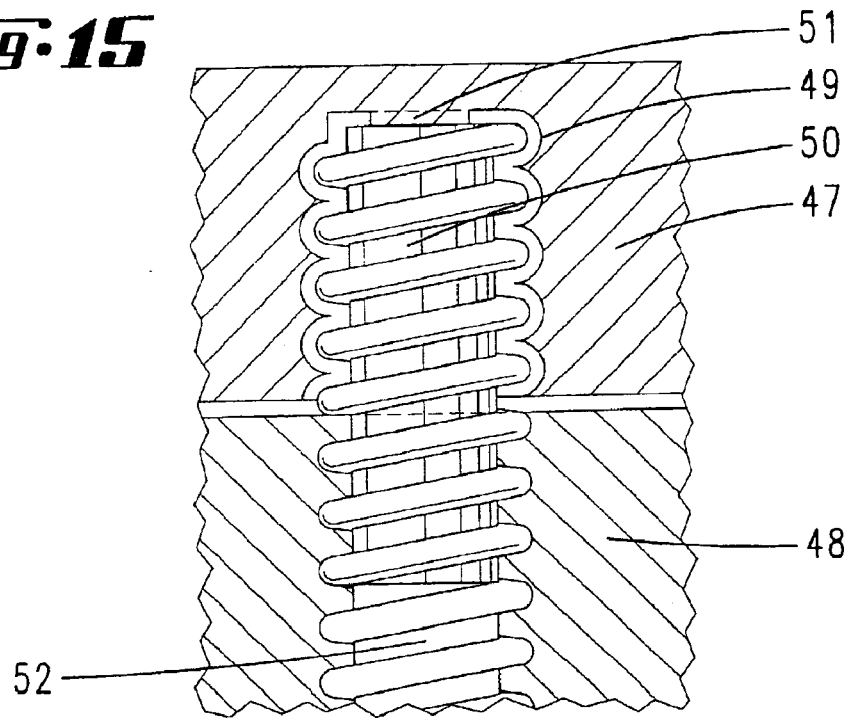
Figure 16:
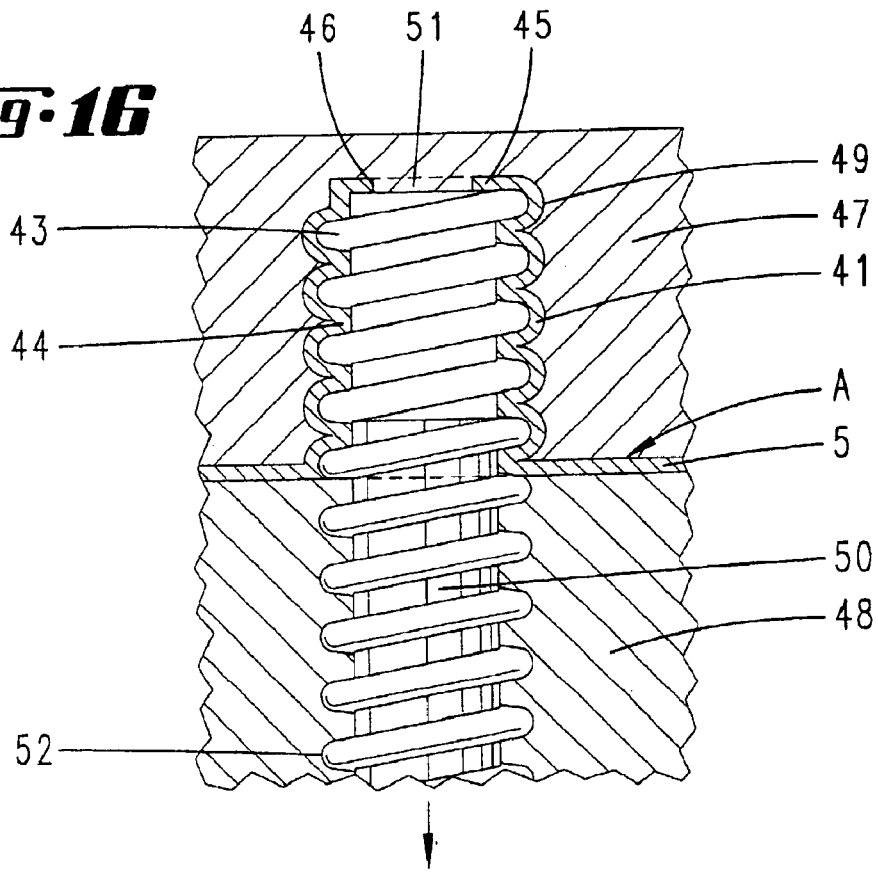
Figure 17:
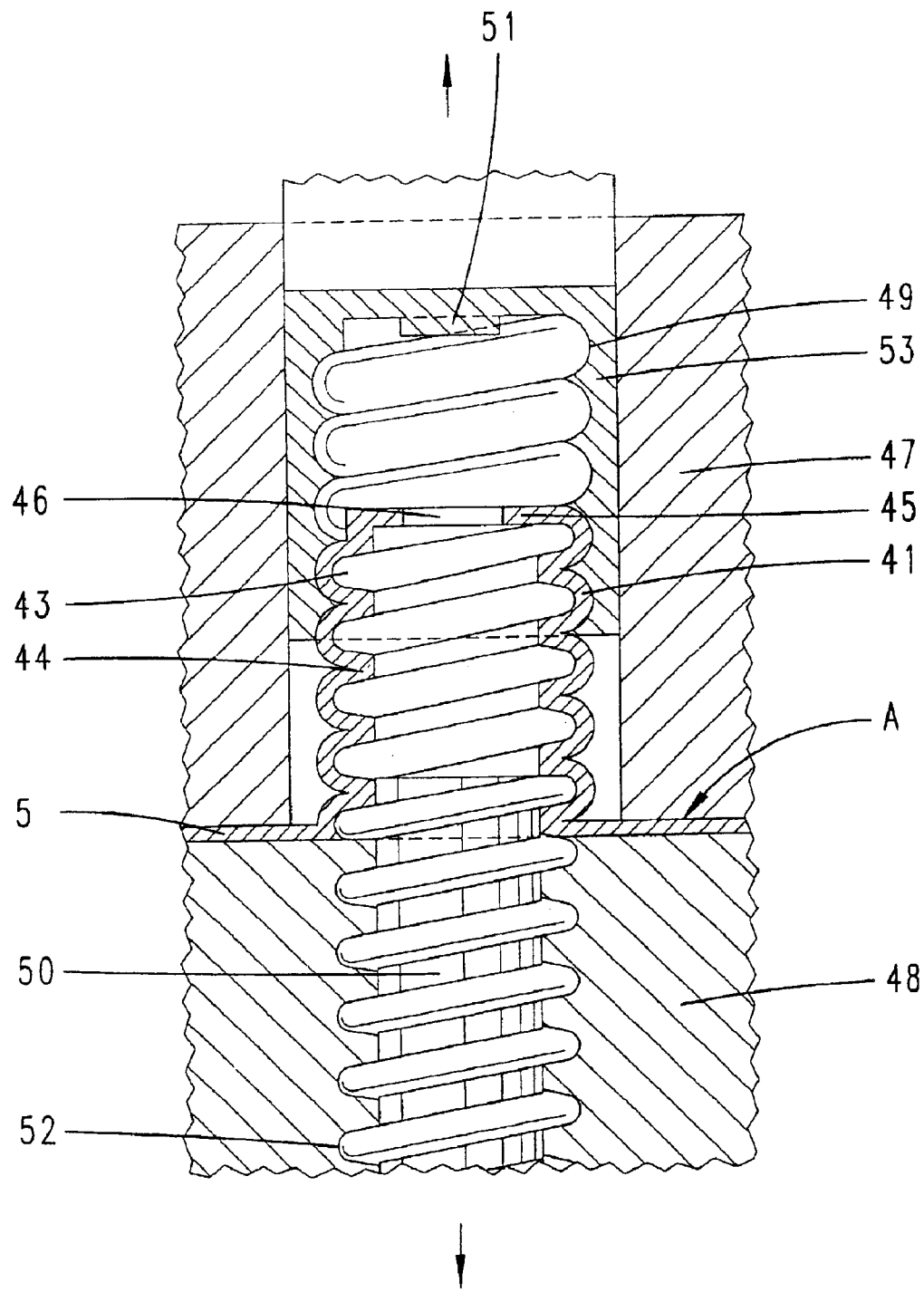

The subject matter of the invention is explained in more detail below on the basis of several exemplary embodiments represented in the drawing, in which:

FIG. 1 shows the sound absorber, associated with an interior end wall or body wall between the engine compartment and the passenger compartment of the motor vehicle, showing bush-like stamped recesses for the passing-through of supply lines between the engine compartment and the passenger compartment of the motor vehicle, in a perspective representation, exposing the sandwich-like structure of the absorber in stages, with a variant of the sound absorber indicated in the manner of dash-dotted lines, FIG. 1a shows the variant of the sound absorber in partial representation, FIG. 2 shows a representation of the basic version, with a cable loom passing through the stamped recess, FIG. 3 shows a largely schematized vertical section through a region of the interior end wall of the motor vehicle, with the engine compartment now lying on the left side, FIG. 4 shows a vertical section through a stamped recess, acting for example as a snap-in means, FIG. 5 shows an identical section with implemented relative positioning for snap-in attachment, FIG. 6 shows a vertical section through a stamped recess, acting as a snap-in means and as a bush, with a central stamped clearance and a cable loom aligned ready for relative positioning, FIG. 7 shows the stamped formation according to FIG. 6 with implemented relative positioning of the cable loom for plug-on attachment, FIG. 8 shows the region of the interior end wall in a perspective view, illustrating the associated absorber with a metallic dividing wall lying on the passenger compartment side, closing an opening in the interior end wall, FIG. 9 shows a view toward the interior end wall, seen from the passenger compartment, FIG. 10 shows a representation like FIG. 8, illustrating a peripheral undercut connection between the absorber and the top layer, FIG. 11 shows in a simplified representation a deep-drawing mold in the closed position, joining and shaping the layers of the absorber, to be precise in the open state, that is to say in the charging position, FIG. 12 shows a representation corresponding to FIG. 11, the lower mold of the deep-drawing mold being occupied by the metallic dividing wall, which is provided with the absorber, FIG. 13 shows the dividing wall in a perspective individual representation, FIG. 14 shows a sectional representation through a cable lead-through recess of the top layer, having groove-like undercuts on the outside, in a further embodiment, FIG. 15 shows the section through a region of a mold for producing a recess according to FIG. 14 by injection molding, FIG. 16 shows a representation corresponding to FIG. 15, but after an inner core has been extrusion-coated and unscrewed for demolding the cable lead-through recess of the sound absorber, FIG. 17 shows an alternative configuration of the mold region for producing the cable lead-through recess.

The interior end wall 3, extending substantially vertically between the engine compartment 1 and the passenger compartment 2 of a motor vehicle, carries a sound absorber A.

The sound absorber A is of a sandwich-like structure. It comprises a layer 4 of absorption material. It is covered over virtually its entire surface area with a layer 5 of fully vulcanized rubber material or silicone material. In addition to this there is a layer 6 which is disposed on the other broad side of the layer 4 of absorption material, in the form of a nonwoven covering. The individual layers of the multilayer sound absorber A adhere to one another.

All the layers 4 to 6 are selected with high temperature resistance taken into account.

With respect to the layer 4 of absorption material, reliance is made on open-cell foamed material. In certain cases, closed-cell foamed material may also be advantageous. A starting thickness of about 15 mm is preferably taken as a basis. This thickness is minimized in regions requiring structure, in some cases to 3 mm, which can be achieved by thermal stamping.

Customary absorber materials are, for example, melamine-resin foamed materials with an apparent density of about 9–13 kg/cbm or polyurethane foamed materials with an apparent density of between 15 and 55 kg/cbm.

On the other hand, however, thermoformable wood-fiber composite material can also be used. Such wood-fiber nonwoven material comprises about 80% wood fibers, 10% binder and 10% process fibers. Apart from the use of wood-fiber nonwoven material, the use of cotton-fiber nonwoven or cotton-wool/bulk nonwoven is also conceivable. Parts made of such material have excellent acoustic properties. Moreover, they are dimensionally stable and have self-extinguishing fire properties.

The layer of rubber providing the top layer, that is layer 5, not only has a sealing effect in the customary sense; rather, with its relatively high weight per unit area, the rubber layer can be used as an alternative to the customarily used heavy layer of the absorbers.

The shaping treatment in the unvulcanized state can achieve great forming depths without damage and can even also accomplish partial material accumulations. Such formations are stamped recesses 7 (impressions) protruding out of the plane of general extent. They form bushes and serve for the relative positioning for snap-in engagement with the interior end wall and/or the side-changing lead-through of cables, tubes and the like. Such a cable loom 8 or cable harness is represented for example FIG. 2. The car body, designated overall there by 9, has an aperture 10 adequate for passage. The shell of the car body 9, formed from stamped sheet-metal parts, may also have a larger aperture, it being possible for a correspondingly large aperture to be closed by a separate metallic dividing wall 11, which for its part then has apertures 12, likewise for leading through the cable loom 8, for example.

The dividing wall 11 comprises, for example, a stamped sheet of aluminium.

With respect to the shape of the stamped formations 7, FIG. 2 shows a substantially cylindrical formation, whereas otherwise a shaping which provides the stamped recess 7 with a conical outer contour is predominantly preferred. The portion of the concomitantly pushed-out layer 4 that is covered in the manner of a pointed helmet adheres in certain regions, or else entirely, on the inner side of the layer 5. The stamped recesses 7 point in different directions of plug-on attachment. They already act in a way providing connection with the car body 9.

The stamped recess 7 achieved by pushing out in a shaping manner is flared on the side facing the engine compartment 1. The flare has the designation 13. It acts as a capturing cavity for the directed placement of the cable loom 8. The tip of the flare has a flattened portion 14. Extending over this in a dome-like manner is a compacted region 15 of the portion of the layer 4 forming part of the stamped recess 7.

The stamped recess 7 has a peripheral bead 16 at the base. It is a snap-in bead. Its bead neck is undercut. Its undercut is designated by 17. This produces the desired patent-fastener-like snap-in connection between the stamped recess 7 and the car body 9 or the dividing wall 11.

From the starting thickness of the material of the layer 4 in sheet form, the latter is highly compacted in the region of the bead 16. This may go to back to one fifth of the starting thickness. The thickened region in question here has the designation 18. In terms of its contour, the frustoconical flare 13 is in this case connected in respect of its wall with a convex annular bead wall 19, which proceeds in a flare-widening manner from an apex 20 into a rounded entry portion 21. This contour is evidently also reflected by the contour of the layer 5. Its apex 22 is just displaced a little further outward. A step formation occurs here. The overall polydirectionality of this active snap-in location of the stamped recess leads to great mechanical stability and good restoring action, so that a high-grade sealing effect is achieved for passage through the aperture 10 and the aperture 12. The sound absorber A may also or additionally be attached to the sheet-metal part by means of adhesive bonding.

For the side-changing lead-through of the cable loom 8, it makes assembly easier if the stamped recess 7 already has in advance a central stamped clearance 23. This is revealed by FIG. 6. The stamping-out may be performed at the same time as the layers of the elements forming the absorber are being joined together.

Cable looms of a larger cross-section may also be provided with a mandrel sleeve, so that the aim can likewise be achieved by a relative positioning means making a hole for itself. On the other hand, a perforated membrane, as shown in FIG. 6, is given preference.

With respect to the material accumulations indicated above, in the sense of a thickening of the layer 5, reference is made to FIG. 3. There, facing the car body 9, such a thickening takes the form of a sealing bead 24. This bead-forming material accumulation is two to three times thicker there than the general thickness of the top layer or layer 5. Pressing into the crest facing the engine compartment 1 is the ridge edge of a bead 25, running in the same direction, of the car body 9. This leads to a sealed peripheral termination between the sound absorber A and the corresponding wall of the car body 9. If the interior end wall 3 is further supplemented by a metallic dividing wall 11, the latter may likewise have corresponding precautionary features. A bead 26 provided there then correspondingly acts with a widened ridge edge against the rear of the sealing bead 24. The dividing wall 11 is secured on the wall of the car body 9 by means of attachment 27. In practice, this is a screw connection.

In a way different to that represented here, the dividing wall 11 may also be disposed in front of the engine compartment 1. The beads 25, 26 then project in the opposite direction.

With respect to the relative positioning of the sound absorber A in relation to the dividing wall 11, it remains to be stated that here, too, a snap-in type of edge connection of a substantially smooth form can also be used. For this purpose, the fully vulcanized layer 5 has a peripherally opening undercut 28, which receives a consequently captively acting holding projection 29 of the rubber.

In the edge region, in the vicinity of the undercut 28, a portion of the layer 5 is deeply recessed in a trench-like manner. The recess has the designation 30. To the rear of this recess, the sound absorber, that is to say its layer 4, is highly compacted, to be precise going from about 15 mm to about 3 mm.

There is also such a recess 30 in the central region of the sound absorber A with the formed-on bush, that is the stamped recess 7.

Returning to these bush-forming stamped recesses 7, reference is also made to FIG. 6 and FIG. 7, the latter of which undergoes a lip-formation 31 on the interior space side when the cable loom 8 is led through, formed by the spurs of the layers 4 to 6 coming into snug contact in a staged manner. Apart from a soundproof seal, this also provides an adaptable, and therefore highly effective, seal against liquids. The edge of the hole of the central stamped clearance 23 is widened against a high returning force, which leads to the desired pressing component in the sense of the sealed termination. This also tolerates cable routes deviating from the alignment represented. The ideal relative positioning is at an angle of about 90 degrees with respect to the general plane of the interior end wall 3. In particular, the elastic layer of the top enhances the perforated-membrane character of these lead-through locations.

The sound absorber A can be produced in customary stamping tools, with conventional processing temperatures and parameters. Such a tool is represented in a largely schematized form in FIGS. 11 and 12 and is designated as a whole by 32. It comprises a vertically movable upper tool 33 and a stationary lower tool 34. Above a base plate 35 and below a base plate 36 of these tools there are heating plates 37 and 38, respectively.

In the base part of the lower tool 34 there is, moreover, a vacuum connection 39 for performing/assisting a corresponding deep-drawing operation. Introduced into the horizontal gap between the upper tool 33 and the lower tool 34 is an absorber-forming stack of layers, comprising an upper nonwoven, designated layer 6; under that lies the layer of absorption material, comprising open-cell or optionally closed-cell foamed material or a wood-fiber composite material, designated layer 4, all this supported by the top layer, a layer 5 of rubber material or silicone material that in the first instance is unvulcanized.

When the mold cavity is closed, a sound absorber A ready for relative positioning for plug-on attachment is obtained, able to be positioned in relation to the interior side wall 3 of the motor vehicle. In this case, the stamped recesses 7 described above can form plug-in connection elements and/ or push through-bushes, it then being possible for the central stamped clearance 23 to be created already in the production process.

FIG. 12 shows the use of the stamping tool 32 in the sense described, the sound absorber A being already positioned in relation to the dividing wall 11 as a carrier during the thermal stamping/deep-drawing operation. Here, too, the stamped recesses 7 can be formed in as anchoring elements, for example by entering the apertures 12 in the dividing wall 11. The layer 5 formed from rubber is thereby provided at the same time with the sealing bead 24. The edge overlap of the apertures 12, which can be seen from FIG. 3, can also be brought about in a simple way by making use the initially still doughy composition, and its deformability, of the corresponding rubber material or silicone material, assuming resilient properties by full vulcanization.

The sound absorber A follows the rich structure, indicated for example in FIG. 13, of the carrier-forming dividing wall 11.

Altogether, a sound absorber A with an integrated heavy rubber layer is obtained. The sound absorber in this case undertakes sealing functions. It is provided with sealing bushes, sleeves and elastic edge seals, which are formed onto it as it is created. The unvulcanized rubber material used together with the easily deformable absorber layer provides cost-effective production. The full vulcanization can be accelerated by corresponding mixing ratios.

The variant shown in FIG. 1a shows that the layer 4 of absorption material there is disposed a second layer 5' of thermoplastic elastomer, for example a fully vulcanized rubber material or silicone material. It suitably extends over the entire surface area of the layer 4, as indicated in the basic version of FIG. 1 by dash-dotted lines. The second layer 5' is associated with the layer 4 of absorption material by being held in between. A substantially central relative position is chosen. This multilayer absorber is further improved with respect to the desired acoustic damping. In this case, the absorber comprises two layers of foamed material or the like and two layers of rubber/elastomer. In this case, it is of course also possible to combine the materials for the absorber layers with one another, such as for example a layer of rubber/elastomer, a layer of wood-fiber nonwoven material, a layer of rubber/elastomer and a layer of, for example, melamine-resin foamed material. In this case, the layer of wood-fiber nonwoven material the preferably faces in the direction of the passenger compartment 2.

Alternatively, or else in combination with the stamped recesses 7 described, stamped recesses 40 can also be formed from the top layer 5 in a way according to the representation in FIG. 14. These also serve for leading through, for example, a cable loom 8 or the like.

These recesses 40 have rubber-like, flexible properties and have a bellows-like geometry.

Consequently, a screw-thread-shaped bead 41 is provided on the outside, whereby groove-like undercuts 42 are formed. The bead 41 has in this case a semicircular cross-section.

This chosen cross-sectional configuration of the bead 41 produces undercuts 42, which are formed in a triangular manner with two concave side lines of the adjacent bead threads running symmetrically in relation to each other.

A screw-thread-like groove 43 is provided on the inside, concentrically in relation to the screw-thread-shaped bead 41.

The bead 41 and the groove 43 are aligned with each other in such a way that a thread associated with the recess 40 in the root region has a spacing with respect to the thread associated with the free end region of the recess 40 provided by a screw-thread-like cylindrical portion 44.

The overall tubular recess 40 is closed in the region of the free end by a cover 45. This centrally has a clearance 46 for the passing-through of the cable loom 8.

The diameter of this clearance 46 may be adapted to the outside diameter of the element to be led through, such as for example the cable loom 8 or else a shaft or the like. It Is also conceivable, however, to make the zone surrounding the clearance 46 so elastic that it comes into snug contact with the cable loom 8 or the like in a lip-like sealing manner.

A method for producing a recess according to FIG. 14 is represented on the basis of FIGS. 15 and 16.

The mold portion responsible for the forming of recess 40 according to the invention has in the customary way an upper mold 47 and a lower mold 48, between which the material for producing the top layer 5 is injected. The upper mold 47 is provided with a bore-like clearance 49, the inner contour of which is shaped in a way corresponding to a screw thread geometry. A screw-displaceable core 50, which is provided with an external thread adapted to the screw thread geometry of the clearance 49, enters this screw-thread clearance 49. The dimensions of the core 50, in particular of its external thread are chosen here in such a way that a screw-thread-shaped annular space, to be filled with injected material, remains between said external thread and the inner contour of the clearance 49.

In the starting position according to FIG. 15, the core 50 acts against a central extension 51, which is on the bottom side and protrudes into the interior of the clearance 49, so that the end face of the core 50 has a spacing with respect to the bottom of the clearance.

In the course of the injection of material, the annular space between the core 50 and the clearance 49 is also filled.

The core 50 is screw-displaceable by means of its external thread in a correspondingly shaped threaded bore 52 in the region of the lower mold 48. As a result, demolding of the formed recess 40 can be achieved by unscrewing the core 50. The representation in FIG. 16 shows a partially retracted position of the core 50.

After this, the final demolding of the top layer 5, provided with the recess 40, is made possible in an extremely simple way. The elastic properties of the injected material allow the bellows-like recess 40 to be drawn out of the clearance 49, which has undercuts.

The fact that the extension 51 is disposed on the bottom side means that a central clearance 46 on the top side is formed at the same time in the recess 40 in the course of the injecting operation.

FIG. 17 shows an alternative method for producing a recess 40 according to the representation in FIG. 14. Provided here is a second core 53, which is provided with a clearance 49 having a screw thread geometry and which is held displaceably in the upper mold 47.

In the course of this method, both the core 50 and the second core 53, shaping the outer contour, are drawn out by turning for demolding the recess 40, after which the recess 40 of the top layer 5 is exposed.

Since the core 50 and the outer core 53 respectively have an external thread and internal thread with the same lead, demolding of a recess 40 having undercuts is made possible in an extremely simple way.

This method proves to be particularly advantageous for producing a top layer 5 with recesses 40 from materials having elastic properties, such as elastomers or thermoplastic elastomers.

Furthermore, before complete demolding, the lower mold 48 can be positioned at a distance from the created top layer 5, to create an intermediate space to be filled with absorption material. In this respect, it is preferred to inject that absorption material, preferably RIM polyurethane, by the RIM process.

All disclosed features are (in themselves) pertinent to the invention. The disclosure of the associated/attached priority documents (copy of the prior patent application) are also hereby incorporated in full in the disclosure of the application, including for the purpose of incorporating features of these documents in claims of the present application.

What is claimed is:

1. A sound absorber comprising:
    (a) a layer of absorption material; and
    (b) a top layer having a tubular recess having an outside surface comprising a plurality of undercuts;
    wherein said undercuts are formed by a screw-thread-shaped bead.

2. The sound absorber according to claim 1 wherein said absorption material is selected from the group consisting of an open-cell foamed material, a closed-cell foamed material, and a wood-fiber composite.

3. The sound absorber according to claim 1 wherein said tubular recess has an inside surface comprising a screw-thread-like groove.

4. The sound absorber according to claim 1 wherein said recess has a central clearance.

5. The sound absorber according to claim 1 wherein said undercuts are triangular in shape, each undercut comprising two symmetrical concave sides.

6. The sound absorber according to claim 1 further comprising a non woven material covering said layer of absorption material on a side facing an engine compartment of the motor vehicle.

7. The sound absorber according to claim 1 further comprising a second layer comprising a thermoplastic elastomer associated with said layer of absorption material.

8. The sound absorber according to claim 7 wherein said thermoplastic elastomer is selected from the group consisting of a fully vulcanized rubber material and a silicone material.

9. The sound absorber according to claim 7 wherein said second layer is held within said layer of absorption material.

10. The sound absorber according to claim 1 wherein said layer of absorption material is produced by a reaction injection molding process.

11. A sound absorber comprising:
    (a) a layer of absorption material having an upper surface;
    (b) a top layer having an outside surface comprising a plurality of undercuts, said top layer covering substantially all of said upper surface of said layer of absorption material, said top layer comprising a thermoplastic elastomer; and
    (c) a stamped formation formed by said layer of absorption material and said top layer.

12. The sound absorber according to claim 11 wherein said thermoplastic elastomer is selected from the group consisting of a fully vulcanized rubber material and a silicone material.

13. The sound absorber according to claim 11 wherein said stamped formation contains at least a local area of compacting of said layer of absorption material.

14. The sound absorber according to claim 11 wherein said formation has a base with a peripheral bead.

15. The sound absorber according to claim 14 wherein said bead comprises a snap-in bead having an undercut.

16. The sound absorber according to claim 15 wherein said layer of absorption material is highly compacted near said bead.

17. The sound absorber according to claim 11 wherein said stamped formation has a central stamped clearance.

18. The sound absorber according to claim 11 wherein said stamped formation has a conical outer contour.

19. The sound absorber according to claim 11 wherein said top layer comprises thickenings forming sealing beads.

20. The sound absorber according to claim 11 wherein said top layer has a high weight per unit area so as to form a heavy layer in acoustic association with said layer of absorption material.

21. A sound absorber comprising:
(a) a layer of sound absorption material; and
(b) a top layer of elastomer having a tubular recess having an outside surface comprising a plurality of undercuts, said tubular recess having a bellows-like geometry.

22. A method for producing a sound absorber comprising a layer of absorption material and a top layer having a cable lead-through recess comprising the steps of:
(a) providing an upper mold and a lower mold for producing the top layer by injection molding;
(b) providing a core having an external thread in a clearance in the upper mold; and
(c) producing a recess in the top layer by injection-molding material for producing the top layer around the core.

23. The method according to claim 22 further comprising the step of unscrewing the core to demold the sound absorber.

24. The method according to claim 22 further comprising the step of forming an outer contour with a second core having an inner contour with a screw thread geometry.

25. The method according to claim 24 further comprising the step of drawing out the core having the external thread and the second core by turning to demold the sound absorber.

26. The method according to claim 22 further comprising the step of forming an absorption layer by a reaction injection molding process after injection-molding the top layer.

27. A sound absorber comprising:
(a) a layer of absorption material; and
(b) a top layer having a tubular recess having an outside surface comprising a plurality of undercuts;
wherein said tubular recess has an inside surface comprising a screw-thread-like groove, said groove having two threads spaced apart in a vertical direction by a screw-thread-shaped cylindrical portion.

* * * * *

UNITED STATES PATENT AND TRADEMARK OFFICE
CERTIFICATE OF CORRECTION

PATENT NO. : 6,951,263 B2
DATED : October 4, 2005
INVENTOR(S) : Blömeling et al.

It is certified that error appears in the above-identified patent and that said Letters Patent is hereby corrected as shown below:

<u>Column 11,</u>
Line 1, after the word "claim" change "15" to read -- 14 --.

Signed and Sealed this

Third Day of January, 2006

JON W. DUDAS
*Director of the United States Patent and Trademark Office*